(12) United States Patent
Lin

(10) Patent No.: US 7,741,905 B2
(45) Date of Patent: Jun. 22, 2010

(54) AUTOMATIC GAIN CONTROL CIRCUIT

(75) Inventor: Jui-Chin Lin, Taipei Hsien (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 20 days.

(21) Appl. No.: 12/185,106

(22) Filed: Aug. 3, 2008

(65) Prior Publication Data
US 2009/0195308 A1 Aug. 6, 2009

(30) Foreign Application Priority Data
Jan. 31, 2008 (CN) .......................... 2008 1 0300280

(51) Int. Cl.
*H03G 3/20* (2006.01)
(52) U.S. Cl. ...................................... 330/136; 330/141
(58) Field of Classification Search ................. 330/136, 330/285, 296–297, 141
See application file for complete search history.

(56) References Cited

U.S. PATENT DOCUMENTS 4,255,716 A 3/1981 Takada
5,281,925 A * 1/1994 Hulick ....................... 330/296

* cited by examiner

*Primary Examiner*—Robert Pascal
*Assistant Examiner*—Khiem D Nguyen
(74) *Attorney, Agent, or Firm*—Frank R. Niranjan

(57) ABSTRACT

An automatic gain control circuit includes a first voltage dividing resistor, a filter circuit, a switch circuit, and an amplifying circuit. The first voltage dividing resistor divides a voltage of the automatic gain control circuit using an internal impedance of the audio device to produce a divided DC voltage, wherein the first voltage dividing resistor is connected between a first power source and an output of the audio device. The filter circuit filters audio signals outputted from the audio device to produce filtered audio signals, and wherein the filter circuit receives the divided DC voltage, wherein the filter circuit is connected to the output of the audio device. The switch circuit outputs controlling signals according to the divided DC voltage from the filter circuit. The amplifying circuit amplifies the filtered audio signals according to the controlling signals. An electronic device using the automatic gain control circuit is also provided.

10 Claims, 2 Drawing Sheets

AUTOMATIC GAIN CONTROL CIRCUIT

BACKGROUND

1. Field of the Invention

Embodiments of the present disclosure relate to electronic circuit and, more particularly to an automatic gain control circuit.

2. Description of Related Art

Electric devices may comprise two major types of microphones, including an electret condenser microphone and a dynamic microphone. Sensitivity difference between these two types of microphones may be at least 10 dB, in one example. In order to support these microphones simultaneously, such electronic devices need an additional circuit for tuning a voice output.

However, when the type of microphones has been changed from one to another, electronic devices typically need to provide a button or a digital display on a panel for volume configuration. If different types of microphones are simultaneously used with the electronic devices, these microphones may produce audio signals with volumes that significantly differ from each other, which may be difficult for users to adjust to.

SUMMARY

One aspect of the present disclosure provides an automatic gain control circuit. The automatic gain control circuit includes a first voltage dividing resistor, a filter circuit, a switch circuit, and an amplifying circuit. The first voltage dividing resistor divides a voltage of the automatic gain control circuit using an internal impedance of the audio device to produce a divided DC voltage, wherein the first voltage dividing resistor is connected between a first power source and an output of the audio device. The filter circuit filters audio signals outputted from the audio device to produce filtered audio signals, and wherein the filter circuit receives the divided DC voltage, wherein the filter circuit is connected to the output of the audio device. The switch circuit outputs controlling signals according to the divided DC voltage from the filter circuit. The amplifying circuit amplifies the filtered audio signals according to the controlling signals. An electronic device using the automatic gain control circuit is also provided.

Other objectives, advantages and novel features of the present disclosure will be drawn from the following detailed description of certain inventive embodiments of the present disclosure with the attached drawings, in which:

DETAILED DESCRIPTION OF CERTAIN INVENTIVE EMBODIMENTS

Figure 1:
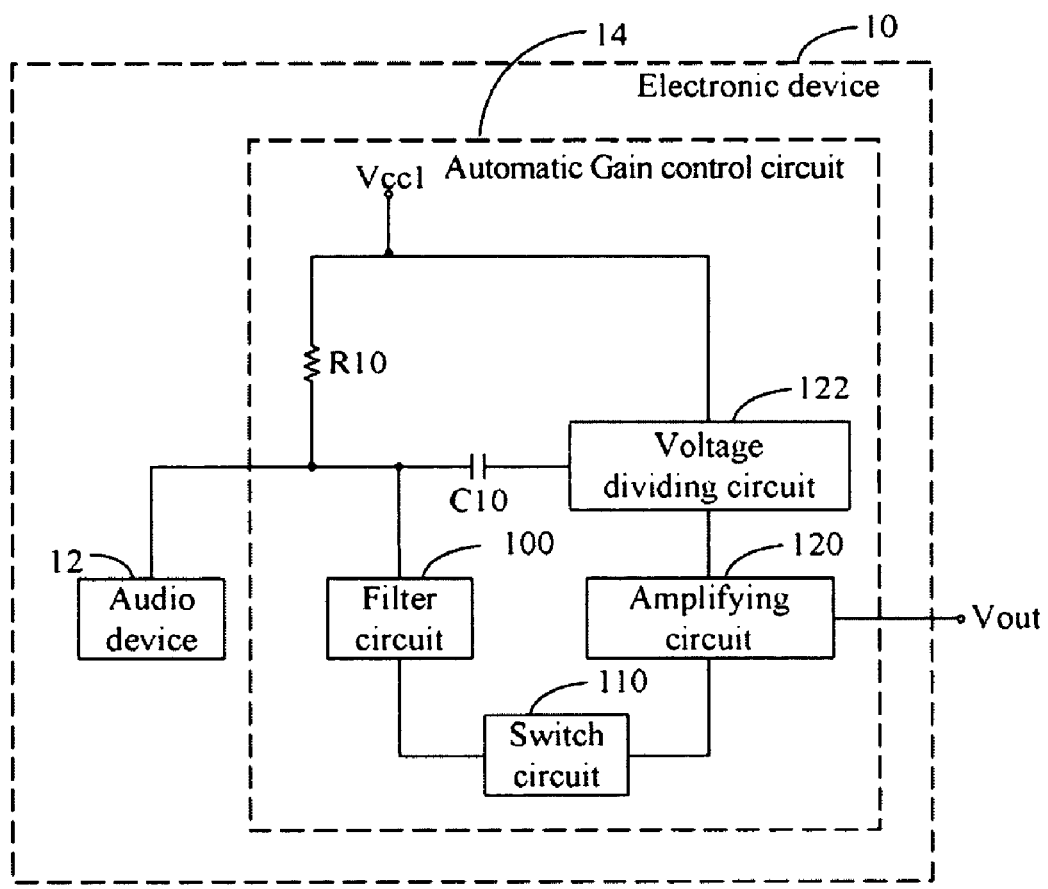
FIG. 1 is a circuit diagram of an electronic device comprising one embodiment of an automatic gain control circuit of the present disclosure.

FIG. 1 is a circuit diagram of an electronic device 10 comprising one embodiment of an automatic gain control circuit 14 of the present disclosure.

The electronic device 10 includes an audio device 12 and the automatic gain control circuit 14. The audio device 12 transforms auditory sounds, such as a human voice, into audio signals. In one embodiment, the audio device 12 may be a microphone. The automatic gain control circuit 14 is connected to the audio device 12 so as to automatically controlling gains of one or more audio signals. In other words, the automatic gain control circuit 14 controls the gains of audio signals if a type of the audio device 12 has been changed. In one embodiment, a gain of an audio signal increases if an internal impedance of the audio device 12 decreases, and accordingly, the gain of the audio signal decreases if the internal impedance of the audio device 12 increases.

In one embodiment, the automatic gain control circuit 14 includes a first voltage dividing resistor R10, a first capacitor C10, a filtering circuit 100, a switch circuit 110, an amplifying circuit 120, and a voltage dividing circuit 122. Further details of the various components of the automatic gain control circuit 14 will be further explained below.

The first voltage dividing resistor R10 connects between a first power source Vcc1 and an output of the audio device 12. The first dividing resistor R10 and an internal impedance of the audio device 12 divide a voltage of the first power source Vcc1 to produce a divided DC voltage.

The first capacitor C10 connects between the audio device 12 and the amplifying circuit 120.

An input end of the filter circuit 100 connects between the output of the audio device 12, the first capacitor C10, and the first voltage dividing resistor R10 so as to filter high frequency audio signals from the audio device 12. The filter circuit 100 receives the divided DC voltage from the first voltage dividing resistor R10. The divided DC voltage changes along with the internal impedance of the audio device 12. In one embodiment, the divided DC voltage increases if the internal impedance of the audio device 12 increases, and accordingly, the divided DC voltage decreases if the internal impedance of the audio devices 12 decreases.

An output end of the filter circuit 100 is connected to an input end of the switch circuit 110. The switch circuit 110 outputs controlling signals to the amplifying circuit 120 according to the divided DC voltage.

The amplifying circuit 120 controls a gain of the audio signals according to the controlling signals from the switch circuit 110. The amplifying circuit 120 includes a first input end, a second input end, and an output end. The first input end of the amplifying circuit 120 is electronically connected to the audio device 12 via the first capacitor C10 for receiving the filtered audio signals. The second input end of the amplifying circuit 120 is connected to the output end of the switch circuit 110 for receiving the controlling signals. The output end of the amplifying circuit 120 is the output end of the automatic gain control circuit 14 for outputting amplified audio signals.

A first end of the voltage dividing circuit 122 is connected to the first power source Vcc1, while a second end of the voltage dividing circuit 122 connects between the first capacitor C10 and the first input end of the amplifying circuit 120. The voltage dividing circuit 122 provides a reference voltage for the amplifying circuit 120.

Figure 2:
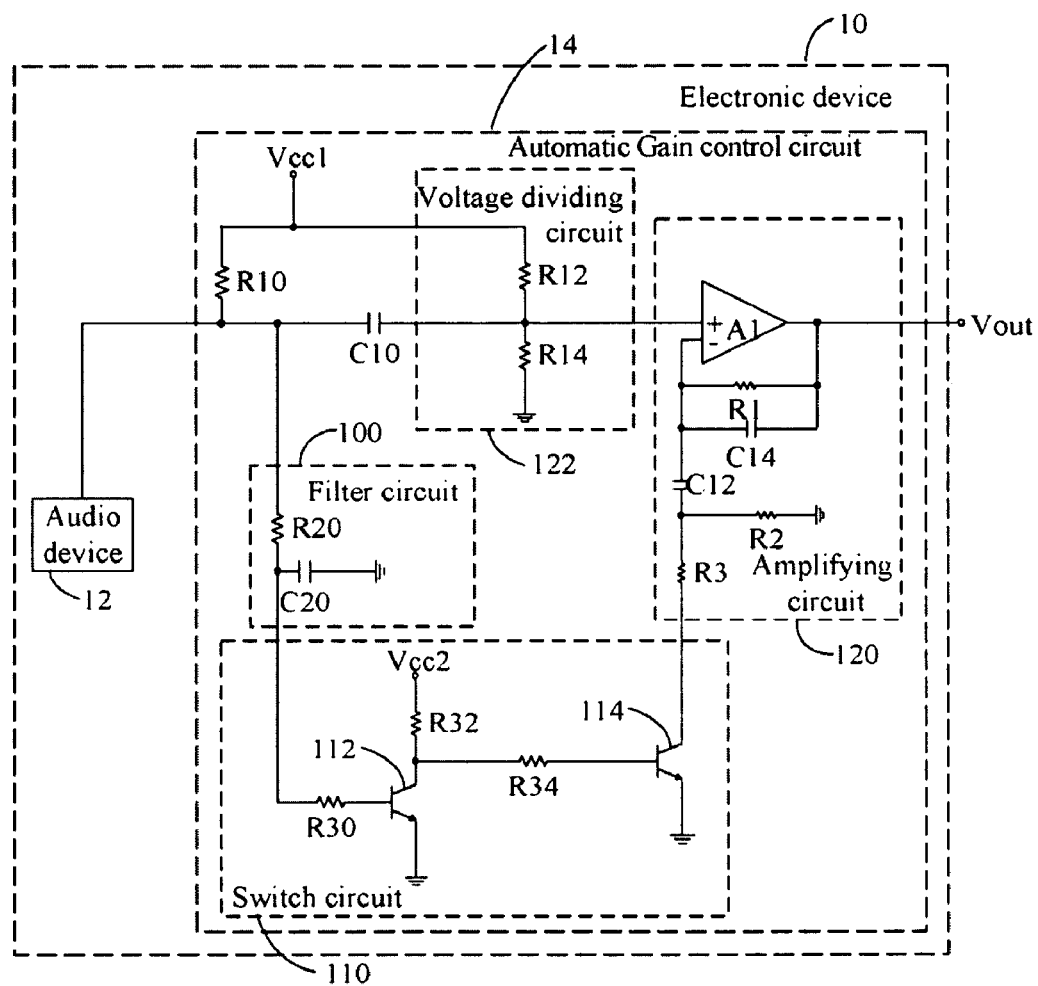
FIG. 2 is one embodiment of a detailed circuit diagram of FIG. 1.

FIG. 2 is one embodiment of a detailed circuit diagram of FIG. 1.

The filtering circuit 100 includes a filtering capacitor C20 and a first current limit resistor R20. In one embodiment, a first end of the first current limit resistor R20 is an input end of the filter circuit 100 and is connected to the output of the audio device 12. A second end of the first current limit resistor R20 is grounded via the filtering capacitor C20, and is also the output end of the filter circuit 100 which is connected to the input end of the switch circuit 110. In one embodiment, the filter circuit 100 receives audio signals from the audio device 12, filters high frequency audio signals out from the audio signals, and sends the filtered audio signals and the DC voltage from the first voltage dividing resistor R10 to the switch circuit 110.

The switch circuit 110 includes a second current limit resistor R30, a third current limit resistor R32, a fourth current limit resistor R34, a first transistor 112, and a second transistor 114. In one embodiment, the second current limit resistor R30 electronically connects between the output end of the filter circuit 100 and a base of the first transistor 112. The input end of the switch circuit 110 is connected to the output end of the filter circuit 100. An emitter of the first transistor 112 is grounded, while a collector of the first transistor 112 is connected to a second power source Vcc2 via the third current limit resistor R32. In another embodiment, the first power source Vcc1 and the second power source Vcc2 may be connected to a same power source. A base of the second transistor 114 is connected to the collector of the first transistor 112 via the fourth current limit resistor R34, while an emitter of the second transistor 114 is grounded. A collector of the second transistor 114 is the output end of the switch circuit 110, which is connected to the amplifying circuit 120. The switch circuit 110 outputs the controlling signals according to the DC voltage. The controlling signals include on/off signals. In one embodiment, if a base-emitter voltage of the first transistor 112 exceeds the threshold voltage of the first transistor 112 due to the DC voltage, the first transistor 112 is turned on, while the second transistor 114 is turned off. In this case, the switch circuit 110 outputs the off signal. If a base-emitter voltage of the first transistor 112 is less than the threshold voltage of the first transistor 112 due to the DC voltage, the first transistor 112 is turned off, while the second transistor 114 is turned on. In this case, the switch circuit 110 outputs the on signal.

The amplifying circuit 120 includes an amplifier A1, a first controlling resistor R1, a second controlling resistor R2, a third controlling resistor R3, a second capacitor C12, and a compensation capacitor C14. The amplifier A1 includes a first input end, a second input end, and an output end. The first input end of the amplifier A1 electronically connected to the audio device 12 via the first capacitor C10 is the input end of the amplifying circuit 120 for receiving audio signals sent by the audio device 12. The output end of the amplifier A1 is the output end of the amplifying circuit 120, and is also the output end of the electronic device 10 for outputting amplified audio signals. The first controlling resistor R1, the second controlling resistor R2, and the third controlling resistor R3 control the gain of the audio signals processed in the amplifier A1. In one embodiment, the compensation capacitor C14 and the first controlling resistor R1 are connected between the second input end and the output end of the amplifier A1 in parallel for compensating the gain of the audio signals. A first end of the second controlling resistor R2 is connected to the second input end of the amplifier A1 via the second capacitor C12, while a second end of the second controlling resistor R2 is grounded. A first end of the third controlling resistor R3 is connected to the second input end of the amplifier A1 via the second capacitor C12, while a second end of the third controlling resistor R3 connected to the output end of the switch circuit 110 is the second input end of the amplifier circuit 120. In other embodiments, the first controlling resistor R1, the second controlling resistor R2, and the third controlling resistor R3 may be connected differently.

The voltage dividing circuit 122 connects between the first power source Vcc1 and the first input end of the amplifying circuit 120 for providing a reference voltage for the amplifier A1. In one embodiment, the voltage dividing circuit 122 includes a second voltage dividing resistor R12 and a third voltage dividing resistor R14. The second voltage dividing resistor R12 connects between the first power source Vcc1 and the first input end of the amplifying circuit 120, while the third voltage dividing resistor R14 connects between the first input end of the amplifying circuit 120 and the ground. In other embodiments, the voltage dividing circuit 122 can be other structures, such as using a thin-film transistor (TFT) as a resistive element, where one or more TFTs may be used as a voltage dividing element.

A gain of the amplifier A1 depends on a total resistance value of the first controlling resistor R1, the second controlling resistor R2, and the third controlling resistor R3. The different controlling signals output by the switch circuit 110 adjusts the total resistance of the amplifying circuit 120 in order to automatically control the gain of the amplifier A1. In one embodiment, the third controlling resistor R3 may have substantially no effect on the gain of the amplifier A1 if the switch circuit 110 outputs the off signal. It may be understood that the gain of the amplifier A1 is a ratio between the cumulative resistance of the first controlling resistor R1 and the second controlling resistor R2 and the resistance of the second controlling resistor R2. In contrast, when the switch circuit 110 outputs the on signal, the total resistance of the second controlling resistor R2 and the third controlling resistor R3 becomes smaller since they are connected in parallel. As a result of the total resistance of the second controlling resistor R2 and the third controlling resistor R3 becoming smaller, the gain of the amplifier A1 is increased.

It may be understood that the DC voltage will increase if the internal impedance of the audio device 12 increases. In this case, the switch circuit 110 outputs the off signal and the amplifier A1 decreases the gain of the audio signals. In contrast, when the internal impedance of the audio device 12 decreases the DC voltage will decrease. In this case, the switch circuit 110 outputs the on signal, and the amplifier A1 increases the gain of the audio signals.

Depending on the embodiment, the audio device 12 may be an electret condenser microphone or a dynamic microphone. In one embodiment, an internal impedance of the electret condenser microphone may be more than 1500 ohms, while an internal impedance of the dynamic microphone may be smaller than 800 ohms. When a user uses the electret condenser microphone, the switch circuit 110 outputs the off signal and, as a result, the automatic gain control circuit 14 automatically reduces the gain of the audio signals. When the user uses the dynamic microphone, the switch circuit 110 outputs the on signal and, as a result, the automatic gain control circuit 14 automatically increases the gain of the audio signals.

Thus, the switch circuit 110 outputs different control signals according to the internal impedance of the audio device 12, which can automatically control the gain of the audio signals.

The description of the present disclosure has been presented for purposes of illustration and description, and is not intended to be exhaustive or limit to the disclosure in the form disclosed. Many modifications and variations will be apparent to those of ordinary skill in the art. Various inventive embodiments were chosen and described in order to best explain the principles of the present disclosure, the practical application, and to enable others of ordinary skill in the art to understand the present disclosure for various embodiments with various modifications as are suited to the particular use contemplated.

What is claimed is:

1. An automatic gain control circuit for controlling gains of audio signals outputted from an audio device, the automatic gain control circuit comprising:
   a first voltage dividing resistor that divides a voltage of the automatic gain control circuit using an internal impedance of the audio device to produce a divided DC voltage, wherein the first voltage dividing resistor is connected between a first power source and an output of the audio device;
   a filter circuit that filters audio signals outputted from the audio device to produce filtered audio signals, and wherein the filter circuit receives the divided DC voltage, wherein the filter circuit is connected to the output of the audio device, wherein the filter circuit comprises a first current limit resistor with one end connected to the output of the audio device and the other end being the output end of the filter circuit, and a filtering capacitor with one end connected to the first current limit resistor and the other end grounded;
   a switch circuit that outputs controlling signals according to the divided DC voltage from the filter circuit; and
   an amplifying circuit that amplifies the filtered audio signals according to the controlling signals, wherein the amplifying circuit comprises a first input end that receives the filtered audio signals, a second input end that receives the controlling signals from the switch circuit, and an output end that outputs the amplified audio signals, wherein the first input end of the amplifying circuit is connected to the audio device via a first capacitor.

2. The automatic gain control circuit as recited in claim 1 wherein the switch circuit comprises:
   a first transistor comprising a base connected to the output end of the filter circuit, an emitter connected to ground, and a collector connected to a second power source; and
   a second transistor comprising a base connected to the collector of the first transistor, an emitter connected to ground, and a collector being the output end of the switch circuit.

3. The automatic gain control circuit as recited in claim 2, wherein the switch circuit further comprises:
   a second current limit resistor electronically connected between the output end of the filter circuit and the base of the first transistor;
   a third current limit resistor electronically connected between the second power source and the collector of the first transistor; and
   a fourth current limit resistor electronically connected between the collector of the first transistor and the base of the second transistor.

4. The automatic gain control circuit as recited in claim 2, wherein the amplifying circuit comprises:
   an amplifier, comprising a first input end, a second input end, and an output end, the first input end being electronically connected to the audio device via the first capacitor and being the first input end of the amplifying circuit for receiving the filtered audio signals, the output end of the amplifier being the output end of the amplifying circuit for outputting amplified audio signals;
   a compensation capacitor connected between the second input end of the amplifier and the output end of the amplifier;
   a first controlling resistor connected between the second input end of the amplifier and the output end of the amplifier;
   a second controlling resistor comprising a first end connected to the second input end of the amplifier via a second capacitor and a second end connected to ground; and
   a third controlling resistor comprising a first end being connected to the second input end of the amplifier via the second capacitor and a second end being the second input end of the amplifier circuit.

5. The automatic gain control circuit as claimed in claim 4, further comprising a voltage dividing circuit that for provides a reference voltage for the amplifier, wherein the voltage dividing circuit is connected between the first power source and the first input end of the amplifying circuit.

6. An electronic device for controlling gains of audio signals outputted from an audio device, comprising:
   an audio device; and
   an automatic gain control circuit, comprising:
   a first voltage dividing resistor that divides a voltage of the automatic gain control circuit using an internal impedance of the audio device to produce a divided DC voltage, wherein the first voltage dividing resistor is connected between a first power source and an output of the audio device;
   a filter circuit that filters audio signals outputted from the audio device to produce filtered audio signals, and wherein the filter circuit receives the divided DC voltage, wherein the filter circuit is connected to the output of the audio device, wherein the filter circuit comprises a first current limit resistor with one end connected to the output of the audio device and the other end being the output end of the filter circuit, and a filtering capacitor with one end connected to the first current limit resistor and the other end grounded;
   a switch circuit that outputs controlling signals according to the divided DC voltage from the filter circuit; and
   an amplifying circuit that amplifies the filtered audio signals according to the controlling signals, wherein the amplifying circuit comprises a first input end that receives the filtered audio signals, a second input end that receives the controlling signals from the switch circuit, and an output end that outputs the amplified audio signals wherein the first input end of the amplifying circuit is connected to the audio device via a first capacitor.

7. The electronic product as recited in claim 6, wherein the switch circuit comprises:
   a first transistor comprising a base connected to the output end of the filter circuit, an emitter connected to ground, and a collector connected to a second power source; and
   a second transistor comprising a base connected to the collector of the first transistor, an emitter connected to ground, and a collector being the output end of the switch circuit.

8. The electronic product as recited in claim 7, wherein switch circuit further comprises:
   a second current limit resistor electronically connected between the output end of the filter circuit and the base of the first transistor;
   a third current limit resistor electronically connected between the second power source and the collector of the first transistor; and
   a fourth current limit resistor electronically connected between the collector of the first transistor and the base of the second transistor.

9. The electronic product as recited in claim 7, wherein the amplifying circuit comprises:

an amplifier, comprising a first input end, a second input end, and an output end, the first input end being electronically connected to the audio device via the first capacitor and being the first input end of the amplifying circuit for receiving the filtered audio signals, the output end thereof being the output end of the amplifying circuit for outputting amplified audio signals;

a compensation capacitor connected between the second input end of the amplifier and the output end of the amplifier;

a first controlling resistor connected between the second input end of the amplifier and the output end of the amplifier;

a second controlling resistor, one end thereof being connected to the second input end of the amplifier via a second capacitor, and the other end thereof being grounded; and a third controlling resistor, with one end being connected to the second input end of the amplifier via the second capacitor and the other end being the second input end of the amplifier circuit.

10. The electronic product as recited in claim 9, further comprising a voltage dividing circuit connected between the first power source and the first input end of the amplifying circuit, for providing a reference voltage for the amplifier.

\* \* \* \* \*